(12) United States Patent
Schenk et al.

(10) Patent No.: US 7,932,788 B2
(45) Date of Patent: Apr. 26, 2011

(54) OSCILLATING, DEFLECTABLE MICROMECHANICAL ELEMENT AND METHOD FOR USE THEREOF

(75) Inventors: Harald Schenk, Dresden (DE); Alexander Wolter, Dresden (DE); Thilo Sandner, Dresden (DE); Christian Drabe, Dresden (DE); Thomas Klose, Dresden (DE)

(73) Assignee: Fraunhofer-Gesellschaft zur Förderung der angewandten Forschung e.v., München (DE)

( * ) Notice: Subject to any disclaimer, the term of this patent is extended or adjusted under 35 U.S.C. 154(b) by 117 days.

(21) Appl. No.: 12/298,101

(22) PCT Filed: Apr. 24, 2006

(86) PCT No.: PCT/DE2006/000745
§ 371 (c)(1),
(2), (4) Date: Jan. 13, 2009

(87) PCT Pub. No.: WO2007/121692
PCT Pub. Date: Nov. 1, 2007

(65) Prior Publication Data
US 2009/0302960 A1     Dec. 10, 2009

(51) Int. Cl.
*H03B 5/18* (2006.01)
*H01L 27/14* (2006.01)

(52) U.S. Cl. ....... 331/96; 331/107 A; 257/414; 257/415; 257/417; 385/10; 385/14; 250/251; 250/214 R (58) Field of Classification Search .......... 257/414, 257/415, 417; 385/10, 14; 250/251, 214 R; 331/96, 107 A
See application file for complete search history.

(56) References Cited

U.S. PATENT DOCUMENTS

| | | | |
|---|---|---|---|
| 5,739,941 A | 4/1998 | Knipe | |
| 6,157,114 A | 12/2000 | Bennig | |
| 6,672,732 B1 | 1/2004 | Niendorf | |
| 2007/0180907 A1 | 8/2007 | Krieg | |

FOREIGN PATENT DOCUMENTS

| DE | 10320725 A1 | 11/2004 |
|---|---|---|
| EP | 0754958 A2 | 1/1997 |
| WO | 9801948 | 1/1998 |
| WO | 0101187 A1 | 1/2001 |
| WO | 03073597 A1 | 9/2003 |

OTHER PUBLICATIONS

International Search Report for Corresponding PCT Application PCT/DE2006/000745, Dec. 27, 2006.
International Preliminary Report on Patentability and Written Opinion for Corresponding PCT Application PCT/DE2006/000745, Dec. 10, 2008.
Envoy S. et al. "Nanofabrication and Electrostatic operation of Single Crystal Silicon paddle Oscillators" Journal of Applied Physic, American Institiute of Physics, New York, US, Dec. 1,1999.

*Primary Examiner* — Arnold Kinkead
(74) *Attorney, Agent, or Firm* — Matthew B. Dernier, Esq.; Gibson & Dernier LLP (57) ABSTRACT

The invention relates to micromechanical elements deflectable in an oscillating manner and to a method for the operation of such elements. In this respect, it is the object of the invention to be able to operate the micromechanical elements in a stable and simple manner on the oscillating deflection while taking account of the respective mechanical resonant frequency. A least one spring element is present on elements in accordance with the invention with which it is held. It is deflected between two reversal points using an electrical AC voltage. The one or more spring element(s) has/have non-linear spring characteristics so that a changed mechanical resonant frequency results in dependence on the respective deflection.

17 Claims, 7 Drawing Sheets

OSCILLATING, DEFLECTABLE MICROMECHANICAL ELEMENT AND METHOD FOR USE THEREOF

BACKGROUND

The invention relates to micromechanical elements deflectable in an oscillating manner and to a method for the operation of such elements.

Spring-mass oscillators are frequently used as oscillators in micromechanics. In this connection, movably supported elements having mass are held by one or more spring elements. The spring elements effect restoring forces in the direction of the position of rest of the deflected elements. The oscillating deflection between two reversal points can be initiated using electrical AC voltage. In this process, the resonant frequency of an element deflected in an oscillating manner can be taken into account and utilized for a maximum deflection achievable with a reduced performance.

The drive therefore frequently takes place at least in the proximity of a resonant frequency.

This is problematic, for example, with a drive concept which is called an "out-of-plane electrode comb" and is described by H. Schenk in the following German language publication: "An innovative microactuator for the one-dimensional and two-dimensional deflection of light"; dissertation 2000; Gerhard-Mercator University Duisburg. In this respect, in addition to a hysteresis effect, further disadvantages also occur. For instance, on the presence of spring elements with linear spring characteristics for the oscillating deflection, only electrical AC voltages can sensibly be used with frequencies larger than the resonant frequencies of the elements to be deflected. This substantially increases the effort and/or cost for the control of such a deflection since the oscillation collapses at a frequency below the resonant frequency.

In the operation of these known elements, a procedure is followed such that the oscillation is started by means of a sequence of voltage pulses having a frequency of a magnitude of the fourfold of the mechanical resonant frequency. In regulated operation, an electrical AC voltage is then used having a frequency corresponding to double the resonant frequency.

It is to be noted that the maximum oscillation amplitude cannot be reached if the frequency is increased starting from lower values. This has the result that with an oscillation with a maximum amplitude of the deflection, every ever so small reduction in the excitation frequency results in the collapse of the oscillation. Accordingly, a new "start-up" with a substantially higher excitation frequency must be carried out as mentioned above.

An exact regulation of frequency and phase is therefore required for stable operation under resonant conditions. Only in this way can work be carried out in stable fashion with maximum deflection. A correspondingly high effort and/or cost for the regulation is necessary.

If this is not reached, or if it cannot be reached, no utilization of the maximum possible deflection is present since, as mentioned, slight deviations from the preset excitation frequency (namely from double the resonant frequency) can result in the breakup of the oscillation. The deflection must therefore be limited to secure a stable operation so that a maximum possible deflection cannot be utilized.

A further point to be considered is the stability of the amplitude of the deflection. It likewise depends on the excitation frequency in the proximity of the resonant frequency. A small change in the excitation frequency in the proximity of the resonant frequency can thus result in an increased rise in the amplitude.

Figure 1:
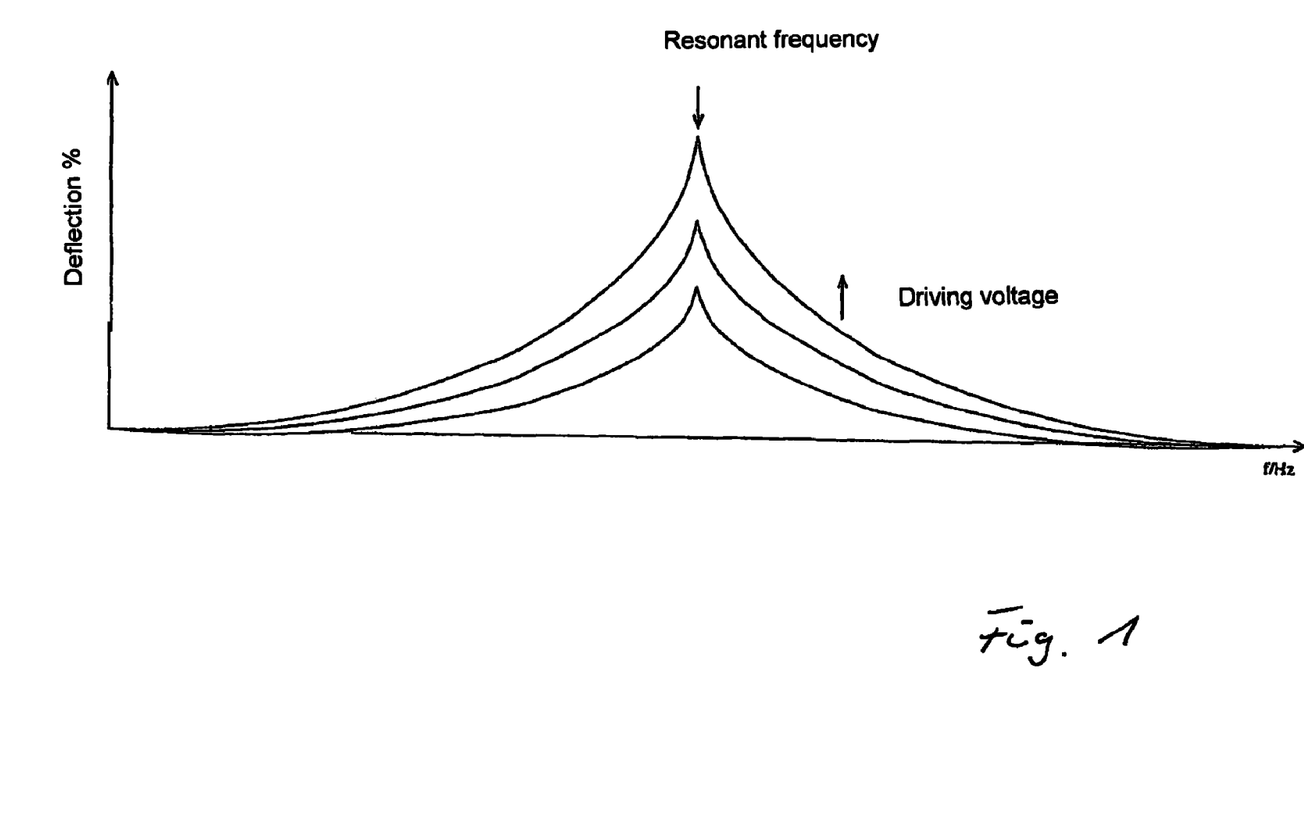
FIG. 1 a diagram of the excitation frequency and deflection while taking account of the resonant frequency with spring elements with linear spring characteristics.
Figure 2:
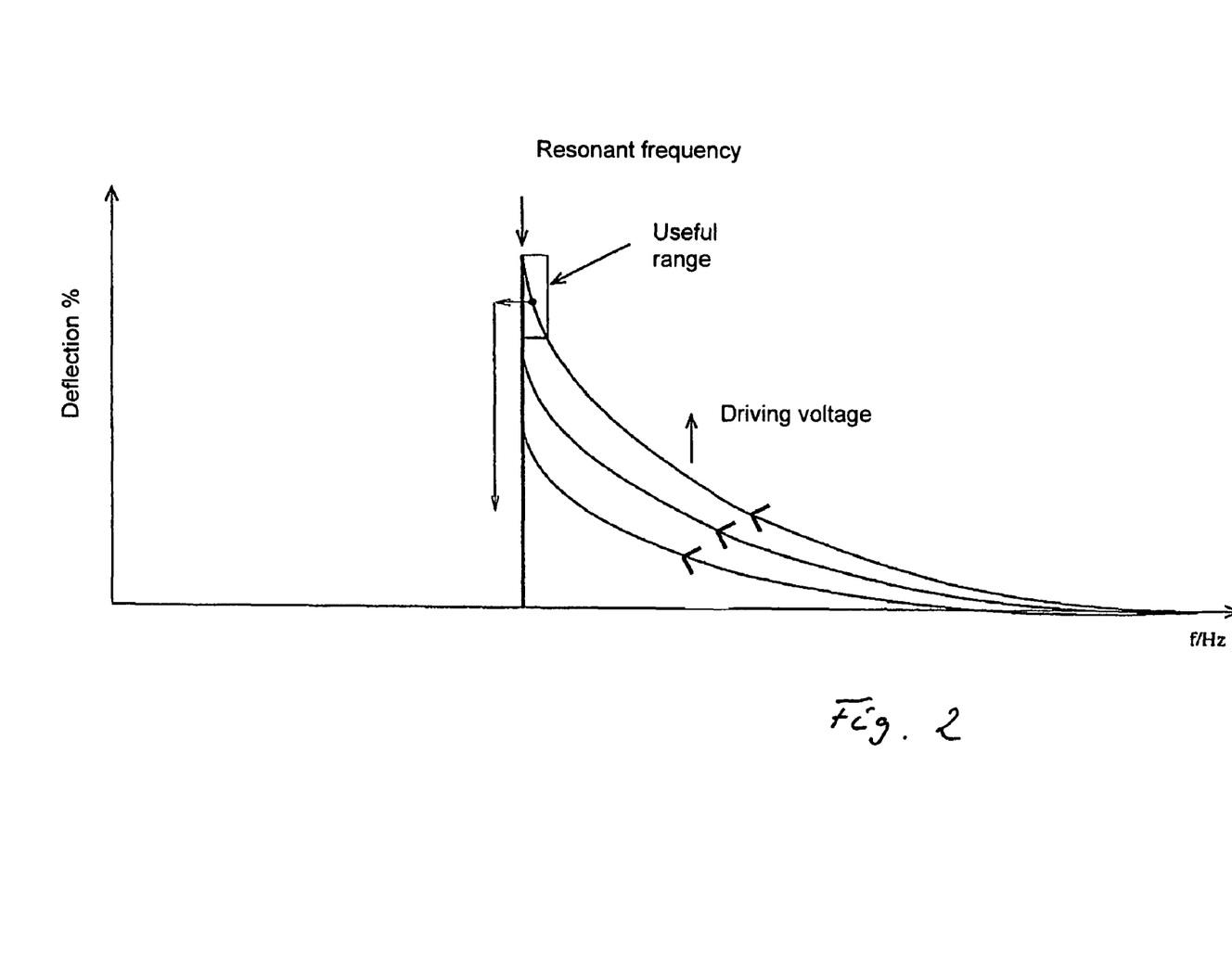
FIG. 2 a diagram of the frequency and deflection of an element with spring elements which have linear spring characteristics and are deflected by means of an out-of-plane electrode comb drive.
Figure 3:
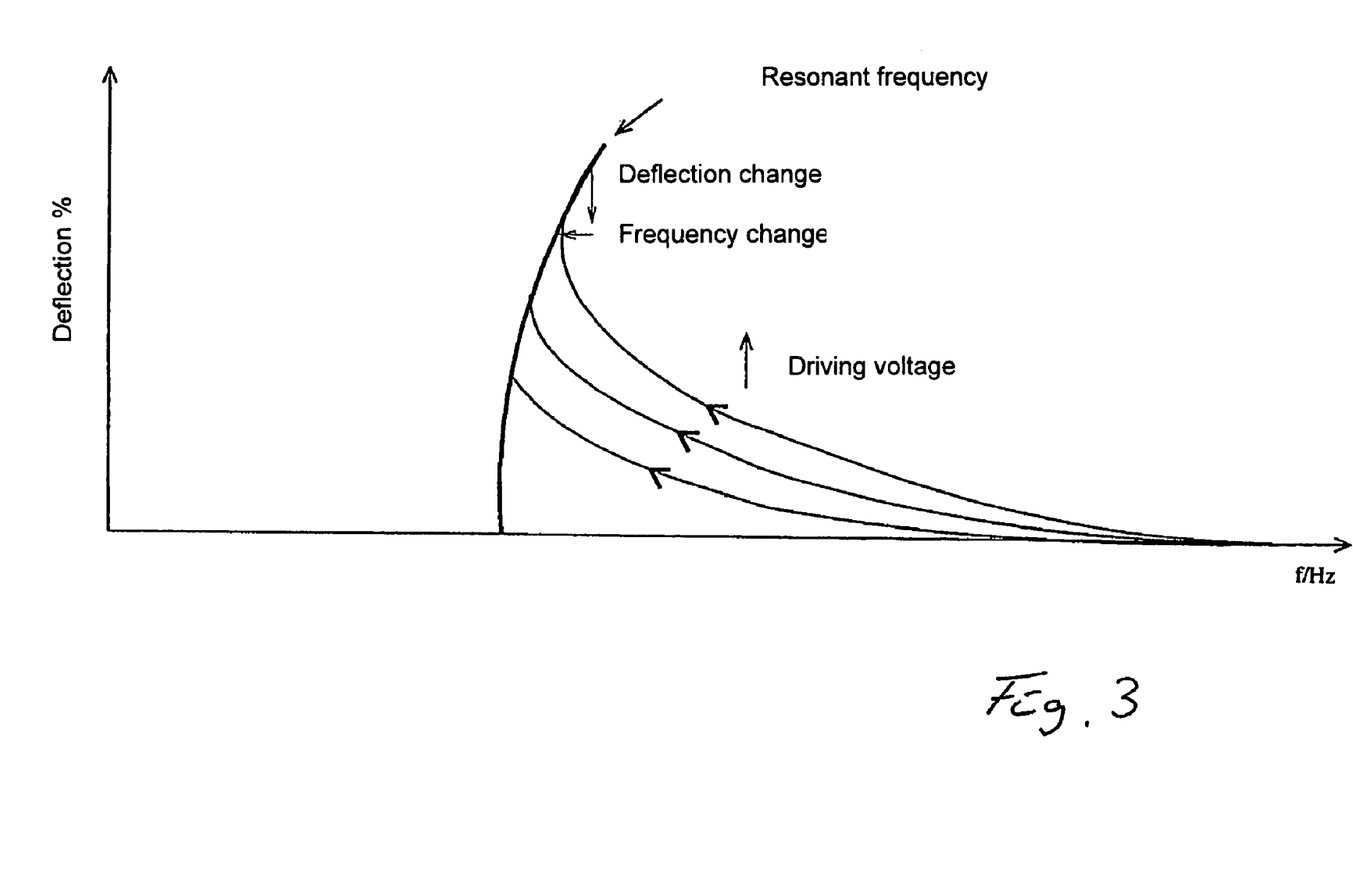
FIG. 3 a diagram of the resonant frequency changing in dependence on the deflection with spring elements with progressive spring characteristics.
Figure 4:
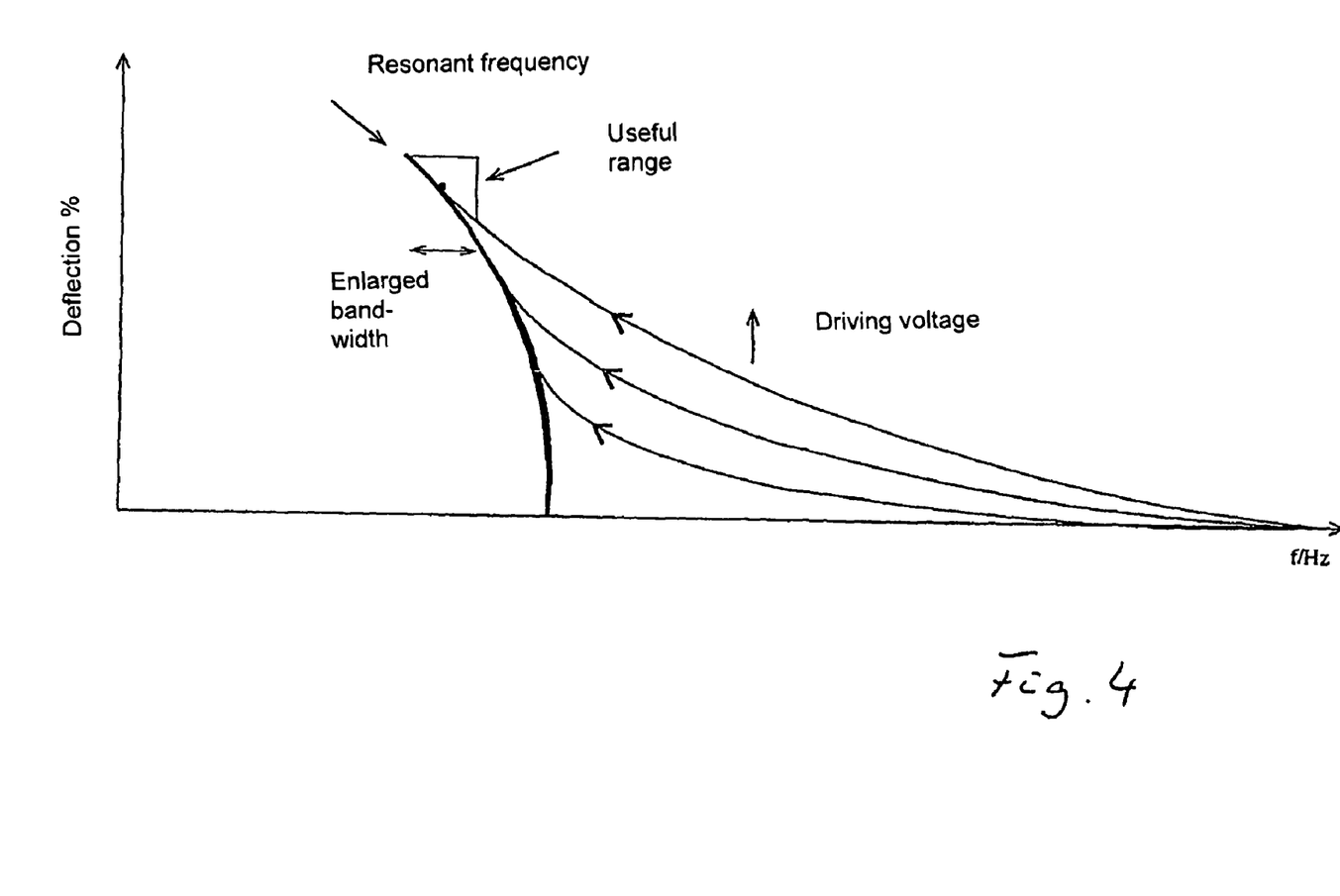
FIG. 4 a diagram of the resonant frequency changing in dependence on the deflection with spring elements with progressive spring characteristics.

These relationships can be better understood with the diagrams shown in FIGS. 2 and 3.

This maximum achievable deflection is in particular limited with a small length and linear spring characteristics of the spring elements used which should be operated at very high frequencies. An element can thus be held by two straight-line torsion spring elements. As the deflection increases, that is, with larger angles of rotation, the torsion spring elements become stiffer and the spring characteristics are then progressive. In conjunction with the previously described disadvantages and with a non-regulated operation, this has the result that the maximum possible deflection cannot be reached. The resonant frequency increases as the deflection rises due to the progressive spring behavior. The frequency response therefore starts to reverse, as can be seen from the diagram shown in FIG. 3. The frequency retardation on start-up would have to be reversed from a specific amplitude/frequency ratio onward, which is not possible in reality in a non-regulated operation.

The resonant frequency is usually a base parameter for the design of oscillating elements/systems which should/can be operated at resonance. Only slight deviations are permitted. It is therefore endeavored to keep the dependence of the frequency on other parameters such as the respective deflection as small as possible. Spring elements are therefore used with linear spring characteristics to avoid a changing resonant frequency.

SUMMARY OF THE INVENTION

It is therefore the object of the invention to provide micromechanical elements deflectable in an oscillating manner which can be operated and/or utilized in a stable and simple manner.

This object is solved in accordance with various embodiments of the invention as shown and described herein. Advantageous aspects and further developments of the invention can be achieved using the features shown and described herein.

The micromechanical elements in accordance with the invention are held by means of at least one spring element. The oscillating deflection between two reversal points can be achieved using an electrical AC voltage. The one or also more spring element(s) has/have non-linear spring characteristics, with the selection of the respective non-linearity being able to take place for the respective specific application.

The respective mechanical natural resonant frequency thereby changes with different deflections. This can be utilized directly, for example, to be able to achieve a deflection which is as large as possible with a small driving energy while utilizing the mechanical natural resonant frequency. In this respect, a frequency can be set for the drive of the deflection which results in natural resonance at a specific deflection. This can be achieved with a plurality of frequencies and then with a respective corresponding deflection of an element. This advantage can be utilized as should still be explained in the following.

A plurality of spring elements should be arranged symmetrically and should be designed and dimensioned in the same shape. The oscillating deflection can be in translation and/or in rotation, that is, it can then take place in the form of a pivoting with angular amounts around a rotational axis. It can be effected in a form known per se using electrostatic forces or also in capacitive manner.

The spring characteristics of spring elements can be degressive and/or progressive, with the combination of degressive and progressive behaviors being able to be taken into account in dependence on the respective deflection.

Degressive behavior can thus, for example, be present with small deflections and progressive behavior with larger deflections.

The deviation of the spring characteristics from the linearity should amount to at least 5%. In this respect, non-linearity should be achieved at least in a region of the respective deflection. This can be a progressive spring behavior, for example, after reaching a specific deflection.

The frequency of the electrical AC voltage with which the oscillating deflection should be effected should be regulatable and also be able to be determined for an evaluation or a detection of measurement parameters, which will be returned to in the following.

The micromechanical elements in accordance with the invention can be made and used in different form. They can thus be made as micro-mirrors (scanner mirrors), as clocks or also as sensor elements.

Pressures or also viscosities of fluids in which the respective element is arranged can be determined with them. As the pressure changes or as the viscosity changes, the attenuation behavior, the respective achievable deflection and the frequency of the electrical AC voltage change. The change in the frequency can be determined relatively easily with a low effort and/or cost and small error and can be evaluated as a measure for the respective pressure or of the viscosity of the fluid (gas).

However, accelerations which act on an element in accordance with the invention can also be determined. The acceleration can act in linear fashion or also be taken into account as angular acceleration.

With an element deflected in an oscillating fashion, an acceleration acting in the direction of the deflection can result in a displacement of the position of rest (central position between reversal points). The frequency of the oscillating deflection thereby also increases with a spring element with progressive spring characteristics. The change in the frequency can thus be used as a measure for the active acceleration.

However, changing masses can also be detected using elements in accordance with the invention. This in particular relates to the dead weight of the element deflected in oscillating manner. A surface can thus be provided, for example, at least regionally with an adhesively acting coating to which specific substances can adhere so that the mass increases. The frequency reduces by an increase in the mass, which results in an increase in the deflection and thereby again in a further reduction of the frequency with increased measurement sensitivity. A degressive spring behavior is favorable for this.

In the detection of the designated measurement parameters, errors can be recognized by changing environmental conditions such as the temperature or atmospheric pressure as a result of the mutually differing time constants and can be taken into account on an evaluation since such pressures and temperatures change a lot more slowly than e.g. an acceleration.

The elements in accordance with the invention can also be used as clocks with a regulated frequency. In this connection, the resonant frequency can be changed and thus a specific clock frequency can be set by changing the deflection, which can e.g. be achieved by changing the electrical voltage.

Influence can also be taken on the oscillating deflection using the invention so that an oscillating deflection differing from a sinusoidal shape can be achieved. For instance, with spring elements whose spring characteristics are degressive, an at least almost trapezoidal deflection movement can be achieved between reversal points and with spring elements with progressive spring characteristics an almost triangular deflection movement can be achieved. Micro-mirrors for display applications can advantageously be operated with the last-named deflection movement since a reversal point of such an oscillation cannot be used.

The invention can moreover be used for data recording, in addition to scanners also in microscopy, for data output in laser displays, in laser printers or laser exposure devices. A use is also possible in Fourier spectrometers, for a path length modulation or for the manipulation of electromagnetic radiation.

Spring elements usable in the invention can be formed by differently designed and dimensioned individual elements arranged next to one another in rows and can quasi form a series circuit. Bending beams or torsion beams can thus be combined with other shapes, for example. Such a beam can e.g. be formed with a branching such as a fork at one or both end faces. Regions can also engage at such a partly beam-shaped spring element whose alignment differs from the longitudinal axis of the beam-shaped part. Spring elements can, however, also be made such that the part engaging at the element to be deflected in oscillating manner and the side which is supported or fixedly clamped have different designs.

A larger frequency range can be utilized with the invention with an oscillating increased deflection by utilization of resonance.

Production tolerances which, for example, effect a corresponding natural resonant frequency can be compensated better. This has a particularly advantageous effect with a multidimensional deflection. In this respect, as a rule, specific frequency ratios have to be maintained on the deflection around at least two axes to enable deflections while observing resonant conditions. If, however, as a result of a non-observed production tolerance parameter, at least one mechanical natural resonant frequency differs, such an operation is not possible. This can, however, be compensated with the invention due to the larger useful frequency range.

If the invention is used with sensitive elements for the detection of physical measurement parameters, their sensitivity can be increased.

BRIEF DESCRIPTION OF THE DRAWING

The technical circumstances should be explained better with the Figures.

There are shown.

DETAILED DESCRIPTION OF THE INVENTION

Figure 5:
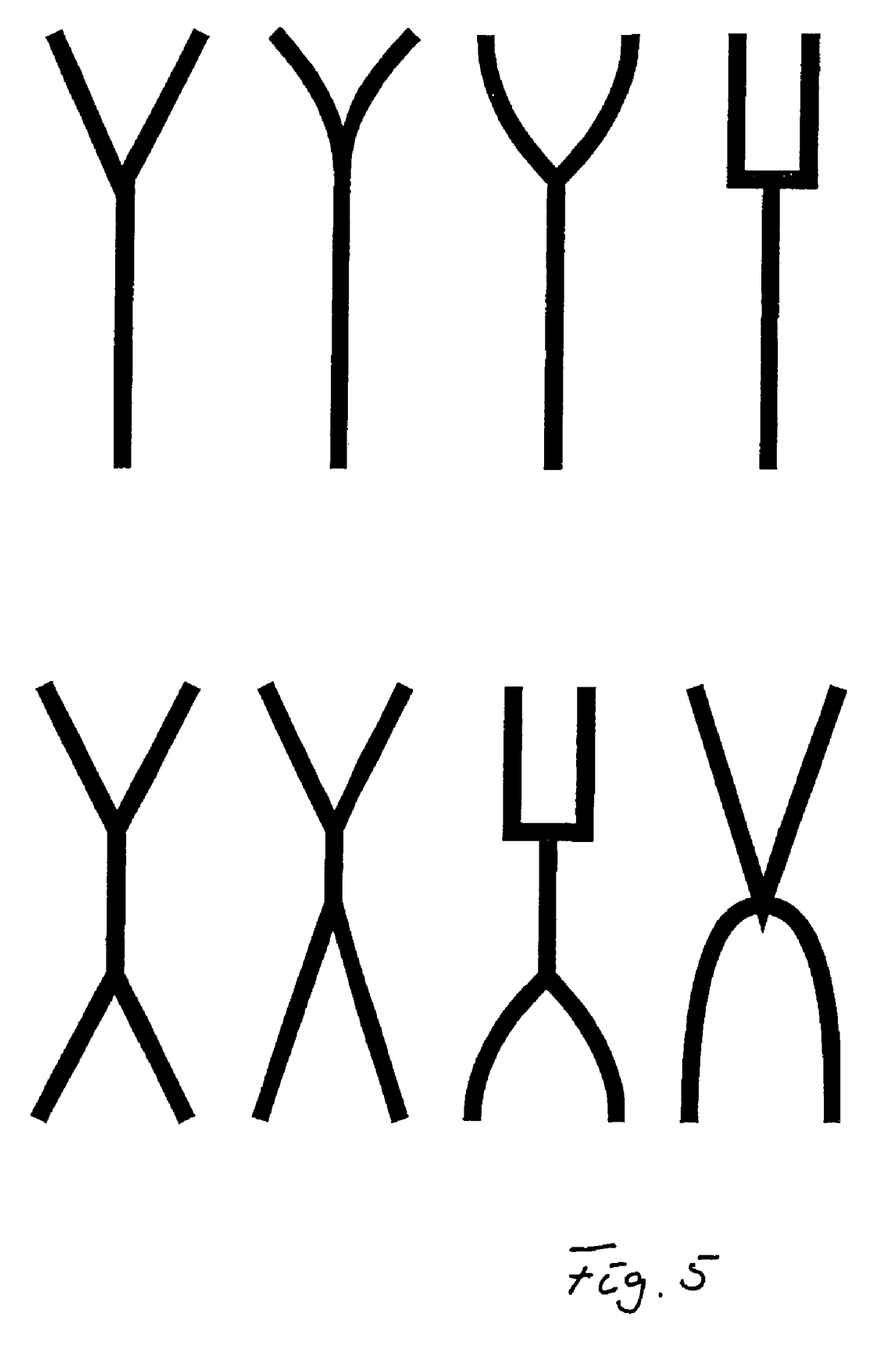
FIG. 5 examples for design forms of spring elements usable in the invention.

Eight examples for possible embodiments of spring elements usable in the invention are thus shown in FIG. 5. A region aligned in a straight line in the direction of the longitudinal axis is shown in all of them with the exception of the example shown at the right in the lower row. The examples shown in the upper row have a fork/branching at an end face which is made in V shape or also in U shape.

The examples shown in the lower row have forks/branches at both end faces which can each also have different designs or be changed with respect to their length in the direction of the longitudinal axis.

The example shown at the far right in the lower row is formed from two forks/branchings directly connected to one another, with one being made in U shape and the other in V shape.

Figure 6:
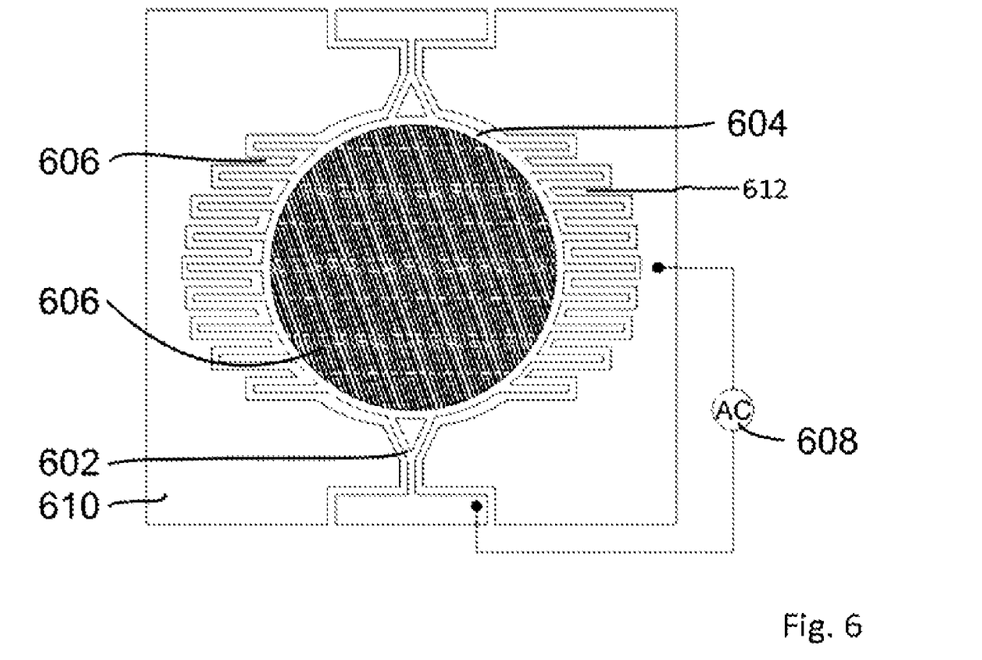
FIG. 6 is a schematic diagram of the micromechanical element in accordance with one or more aspects of the invention.

FIG. 6 shows a schematic diagram 600 of a micromechanical element in accordance with one or more aspects. The micromechanical element can be formed as a comb drive element 604 in accordance with such aspects and is connected to the substrate 610 by means of at least one spring element 602. The spring element 602 has non-linear spring characteristics having a deviation or difference of at least 5% from a linear spring characteristic in at least one region of the deflection. An AC voltage 608 is applied between the comb drive element 604 and a second stationary comb element 612 thereby facilitation actuation of the comb drive element 604 and hence causing a deflection of the spring element 602. In addition, the comb drive element 604 includes a surface 606 that is provided at least regionally with an adhesively acting coating to which specific substances can adhere so that the mass of the comb drive element 604 which is oscillating, can be increased.

Figure 7:
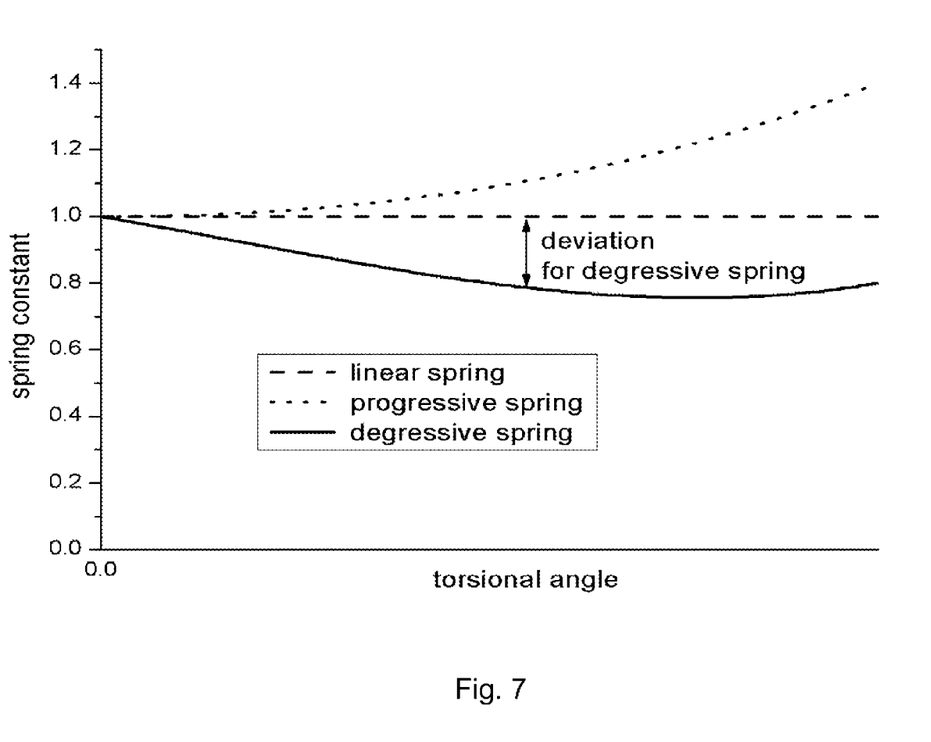
FIG. 7 is a graph comparing characteristics of progressive and degressive springs with that of a linear spring.

FIG. 7 is a graph comparing characteristics of progressive and degressive springs with that of a linear spring wherein deviation of the spring progressive/degressive characteristics from linearity amounts to at least 5%.

The invention claimed is:

1. A micromechanical element which is deflectable in an oscillating manner, the micromechanical element is held by at least one spring element and is deflectable between two reversal points by means of an electrical AC voltage, wherein the spring element(s) has/have non-linear spring characteristics and thus a mechanical resonant frequency results which changes in dependence on the respective deflection such that a deviation of a non-linearity of spring characteristics from the one or more spring element(s) reaches at least 5% in at least one region of the deflection of the micromechanical element.

2. An element in accordance with claim 1, wherein the deflection takes place in translation or in rotation.

3. An element in accordance with claim 1, wherein the deflection takes place by means of electrostatic or capacitive force effect.

4. An element in accordance with claim 1, wherein the spring characteristics of the spring element(s) is degressive and/or progressive.

5. An element in accordance with claim 1, wherein a frequency of the electrical AC voltage can be regulated and determined.

6. An element in accordance with claim 1, wherein the micromechanical element forms a micro-mirror, a clock or a sensor element.

7. An element in accordance with claim 5, wherein the micromechanical element is a pressure sensor, a viscosity sensor, a mass sensor or an accelerometer.

8. An element in accordance with claim 1, wherein a surface of the element is provided at least regionally with an adhesively acting coating.

9. A method of operating an element in accordance with claim 1, wherein the deflection of the element is carried out while observing resonant conditions while taking account of the mechanical resonant frequency changing in dependence on the respective deflection.

10. A method in accordance with claim 9, wherein the frequency of the electrical AC voltage used for the deflection is determined in dependence on the deflection and/or on an acceleration of the element.

11. A method in accordance with claim 9, wherein the change of the amplitude of the deflection is determined by determining the frequency.

12. A method in accordance with claim 9, wherein a pressure or a viscosity of a fluid in which the element is arranged is determined by determining the changing frequency.

13. A method in accordance with claim 9, wherein a changing mass of the element is determined by determining the changing frequency.

14. A method in accordance with claim 9, wherein an acceleration acting on the element is determined by determining the changing frequency.

15. A method in accordance with claim 9, wherein a shape of the deflection movement is brought into trapezoid shape by spring element(s) with degressive spring characteristics and into triangular shape by spring element(s) with progressive spring characteristics.

16. A micromechanical element which is deflectable in an oscillating manner, the micromechanical element is held by at least one spring element and is deflectable between two reversal points by means of an electrical AC (alternating current) voltage, wherein the at least one spring element has non-linear spring characteristics that result in a mechanical resonant frequency which changes in dependence on the respective deflection, wherein a surface of the micromechanical element is provided at least regionally with an adhesively acting coating.

17. A micromechanical element which is deflectable in an oscillating manner, the micromechanical element is held by at least one spring element and is deflectable between two reversal points by means of an electrical AC voltage, wherein the at spring element(s) has/have non-linear spring characteristics and thus a mechanical resonant frequency results which changes in dependence on the respective deflection wherein the deflection of the micromechanical element is carried out while observing resonant conditions while taking account of the mechanical resonant frequency changing in dependence on the respective deflection, wherein a shape of the deflection movement is brought into trapezoid shape by spring element(s) with degressive spring characteristics and into triangular shape by spring element(s) with progressive spring characteristics.

* * * * *